(12) United States Patent
Hart et al.

(10) Patent No.: US 7,994,836 B2
(45) Date of Patent: Aug. 9, 2011

(54) LATCH WITH CLOCKED DEVICES

(75) Inventors: Jason M. Hart, Hayden, ID (US);
Robert P. Masleid, Monte Sereno, CA (US)

(73) Assignee: Oracle America, Inc., Redwood City, CA (US)

( * ) Notice: Subject to any disclaimer, the term of this patent is extended or adjusted under 35 U.S.C. 154(b) by 243 days.

(21) Appl. No.: 12/476,170

(22) Filed: Jun. 1, 2009

(65) Prior Publication Data
US 2010/0301914 A1 Dec. 2, 2010

(51) Int. Cl.
*H03K 3/356* (2006.01)
(52) U.S. Cl. ........ 327/208; 327/210; 327/211; 327/212; 327/218
(58) Field of Classification Search .................. 327/202, 327/203, 208, 210–212, 214, 215, 218
See application file for complete search history.

(56) References Cited

U.S. PATENT DOCUMENTS

| | | | | |
|---|---|---|---|---|
| 7,164,302 B1 * | 1/2007 | Elkin | ............................. | 327/208 |
| 2003/0062940 A1 * | 4/2003 | Nedovic et al. | ................ | 327/211 |

* cited by examiner

*Primary Examiner* — Long Nguyen
(74) *Attorney, Agent, or Firm* — Osha • Liang LLP (57) ABSTRACT

A latch circuit includes a feed-forward circuit, a keeper circuit, and a feed-back circuit. The feed-forward circuit includes a first-inverting-stage with a first input and a first output, wherein the first-inverting-stage comprises a first clocked device, and a second-inverting-stage with a second input and a second output, wherein the second-inverting-stage comprises a second clocked device, and a keeper circuit. The first output is operatively connected to the second input. The keeper circuit is operatively connected to the first output, and the keeper circuit is driven from the second output. The feed-back circuit includes a third-inverting-stage with a third input and a third output, wherein the third input is operatively connected to the second output, and a fourth-inverting-stage with a fourth input and a fourth output. The fourth input is operatively connected to the third output. The fourth output is connected to the third input to form a storage node.

18 Claims, 7 Drawing Sheets

LATCH WITH CLOCKED DEVICES

BACKGROUND

Latches and flip-flops are widely used state elements. Latches are state elements that hold a particular state for a half clock cycle, whereas flip-flops are state elements that hold a particular state for a full clock cycle. Latches have two common modes of operation, transparent mode and hold mode. New data can be written directly to a latch in transparent mode. Meanwhile, a latch in hold mode blocks the writing of data to the latch and stores previous data in the latch.

SUMMARY

In one or more embodiments, the present invention relates to a latch circuit comprising: a feed-forward circuit comprising: a first-inverting-stage with a first input and a first output, wherein the first-inverting-stage comprises a first clocked device with gate driven by a source clock signal, a second-inverting-stage with a second input and a second output, wherein the second-inverting-stage comprises a second clocked device with gate driven by the source clock signal, and wherein the first output is operatively connected to the second input, a keeper circuit operatively connected to the first output, wherein the keeper circuit is driven from the second output; and a feed-back circuit comprising: a third-inverting-stage with a third input and a third output, wherein the third input is operatively connected to the second output, a fourth-inverting-stage with a fourth input and a fourth output, wherein the fourth input is operatively connected to the third output, and wherein the fourth output is connected to the third input to form a storage node, wherein the latch circuit consists of no more than four clocked devices that switch with the source clock signal.

In one or more embodiments, the present invention relates to a semiconductor device comprising: a mechanical package; and a semiconductor die comprising: a semiconductor layer, a plurality of metal layers, a clock distribution network that distributes a clock signal within the die, and a latch circuit comprising: a feed-forward circuit comprising: a first-inverting-stage with a first input and a first output, wherein the first-inverting-stage comprises a first clocked device with gate driven by a source clock signal, and wherein the source clock signal is derived from the clock signal, a second-inverting-stage with a second input and a second output, wherein the second-inverting-stage comprises a second clocked device with gate driven by the source clock signal, and wherein the first output is operatively connected to the second input, a keeper circuit operatively connected to the first output, wherein the keeper circuit is driven from the second output, and a feed-back circuit comprising: a third-inverting-stage with a third input and a third output, wherein the third input is operatively connected to the second output, a fourth-inverting-stage with a fourth input and a fourth output, wherein the fourth input is operatively connected to the third output, and wherein the fourth output is connected to the third input to form a storage node, wherein the latch circuit consists of no more than four clocked devices that switch with the source clock signal.

In one or more embodiments, the present invention relates to a system comprising: an input device; an output device; a mechanical chassis; a printed circuit board; and a semiconductor device comprising: a mechanical package, and a semiconductor die comprising: a semiconductor layer, a plurality of metal layers, a clock distribution network that distributes a clock signal within the die, and a latch circuit comprising: a feed-forward circuit comprising: a first-inverting-stage with a first input and a first output, wherein the first-inverting-stage comprises a first clocked device with gate driven by a source clock signal, and wherein the source clock signal is derived from the clock signal, a second-inverting-stage with a second input and a second output, wherein the second-inverting-stage comprises a second clocked device with gate driven by the source clock signal, and wherein the first output is operatively connected to the second input, a keeper circuit operatively connected to the first output, wherein the keeper circuit is driven from the second output, and a feed-back circuit comprising: a third-inverting-stage with a third input and a third output, wherein the third input is operatively connected to the second output, a fourth-inverting-stage with a fourth input and a fourth output, wherein the fourth input is operatively connected to the third output, and wherein the fourth output is connected to the third input to form a storage node, wherein the latch circuit consists of no more than four clocked devices that switch with the source clock signal.

Other aspects and advantages of the invention will be apparent from the following description and the appended claims.

DETAILED DESCRIPTION

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Figure 1:
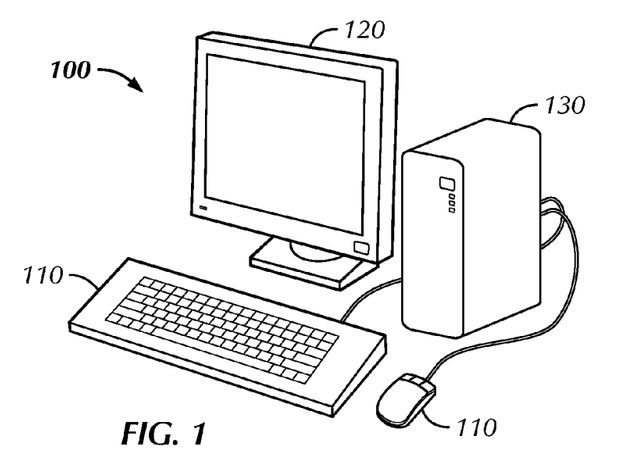
FIG. 1 shows a system in accordance with one or more embodiments of the present invention.

FIG. 1 shows a system in accordance with one or more embodiments of the present invention. A system 100 includes input devices 110, an output device 120, and a mechanical chassis 130. The mechanical chassis 130 includes a printed circuit board ("PCB"), a network device, and a storage device (not shown).

Figure 2:
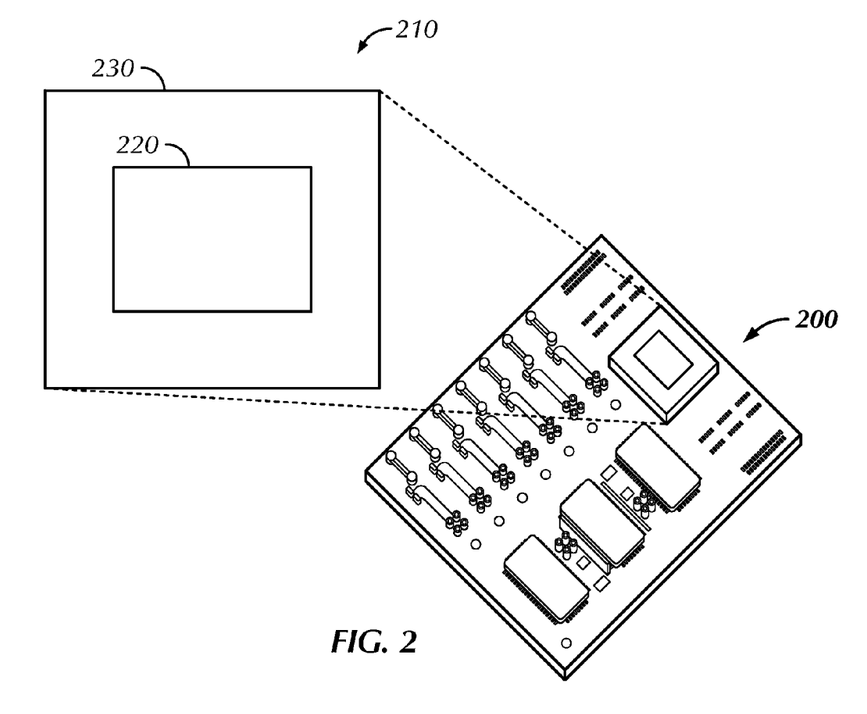
FIG. 2 shows a printed circuit board that includes one or more semiconductor device(s) that each includes one or more semiconductor die in accordance with one or more embodiments of the present invention.

FIG. 2 shows a printed circuit board that includes one or more semiconductor device(s) that each include one or more semiconductor die in accordance with one or more embodiments of the present invention. The PCB 200 may be included in system 100 of FIG. 1 and includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 210. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. Clock distribution networks are used to provide the clock signals to the proper loads within the die 220.

The clock distribution network is organized as a hierarchy of three functional layers that distribute the clock within the semiconductor die: the tree layer, the grid layer, and the local layer. The tree layer includes a fractal clock tree that spans a large area of the die. The grid layer includes clock routes to the individual clock users via a clock grid. The local layer includes clock routes to the actual latches and flip-flops.

A significant portion of switching current consumed in latches and flip-flops comes from clock load. The clock signal switches twice every cycle, while logic nodes commonly switch only once every 10 or more cycles. Therefore, the clock signal generally switches more than 20 times as often as a logic node. As such, latches and flip-flops with reduced clock load are key to reducing the switching current.

Figure 3:
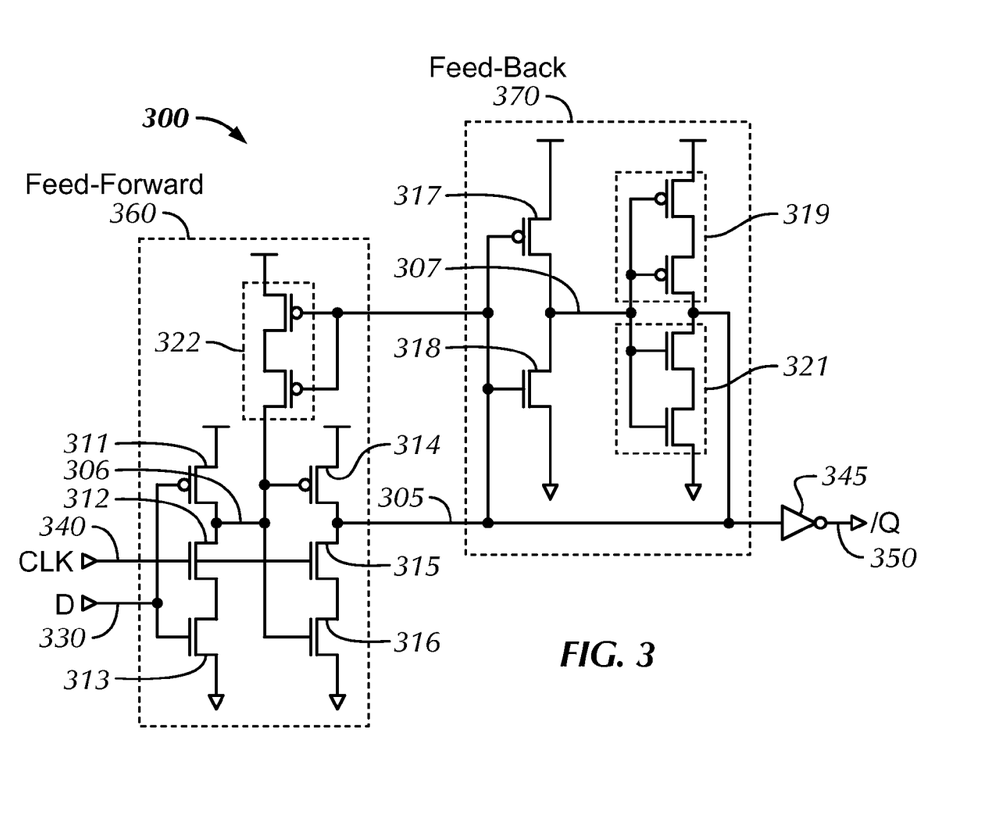
FIG. 3 shows a first latch with two clocked devices in accordance with one or more embodiments of the present invention.

FIG. 3 shows a first latch 300 with two clocked devices driven by a source clock signal in accordance with one or more embodiments of the present invention. As can be seen, the source clock signal CLK 340 only drive two clocked devices, each of which is an n-channel field-effect transistor ("N-FET"), N-FET 312 and N-FET 315. The latch 300 reduces loading on CLK 340 by driving a reduced field-effect transistor ("FET") count as compared to prior art, which typically require a source clock signal to drive 4-6, or even more, FETs. The reduced loading on CLK 340 helps in significant reduction of switching current, because source clock signal switches twice every cycle, whereas logic node commonly switches once every 10 or more cycles. Therefore, the source clock signal switches over 20 times as often as the logic node, and reduced clock load helps significantly in the reduction of switching current.

The latch 300 is built with a feed-forward circuit 360 and a feed-back circuit 370. While dual p-channel field-effect transistors ("P-FETs") are shown, P-FET 319 and P-FET 322 could be replaced with a single P-FET of an appropriate size. In the same way, while the N-FET 321 is shown as dual N-FETs, the two N-FETs could be replaced with a single N-FET of appropriate size. The subsequent description for FIG. 3 is based upon single P-FET 319, single P-FET 322, and single N-FET 321 for simplicity. However, it will be apparent to those knowledgeable in the art that description is equally applicable in case of dual P-FETs and dual N-FETs.

The feed-forward circuit 360 is built with FETs 311, 312, 313, 314, 315, 316, and 322. The series stack of P-FET 311, N-FET 312, and N-FET 313 comprises a first-inverting-stage, with a first input and a first output, wherein the first output is at node 306. The gates of P-FET 311 and N-FET 313 comprise the first input and are driven by D (data-input signal) 330. The series stack of P-FET 314, N-FET 315, and N-FET 316 comprises a second-inverting-stage with a second input and a second output, wherein the second output is at node 305. The gates of P-FET 314 and N-FET 316 comprise the second input and is driven by node 306, which is also the first output. The N-FETs 312 and 315 are driven by CLK 340.

The latch 300 in FIG. 3 is in a transparent mode with CLK 340 in a high logic state, and the latch 300 is in a hold mode with CLK 340 in a low logic state. The P-FET 322 comprises a keeper circuit which is active when the node 306 has to be maintained at high logic state during the hold mode. The gate of keeper P-FET 322 is driven by the node 305.

The feed-back circuit 370 is built with FETs 317, 318, 319, and 321. The series stack of P-FET 317 and N-FET 318 comprises a third-inverting-stage, with a third input and a third output, wherein the third output is at node 307. The gates of P-FET 317 and N-FET 318 comprise the third input and is driven by node 305. The series stack of P-FET 319 and N-FET 321 comprises a fourth-inverting-stage, with a fourth input and a fourth output, wherein the fourth output is at node 305. The gates of P-FET 319 and N-FET 321 comprise the fourth input and is driven by node 307, which is also the third output. The fourth output at node 305 also comprises a storage node. The way in which the third-inverting-stage and the fourth-inverting-stage have been inter-connected is commonly referred to as back-to-back connection. The inverter 345 is an output buffer, with storage node 305 as input and /Q (inverted latch output signal) 350 as output.

During the transparent mode, with the CLK 340 in high logic state, data-in at D 330 is transmitted to node 305 through the first-inverting-stage and the second-inverting-stage. A high logic state of data-in at D 330 during transparent mode will pull down the node 306 to low logic state. The N-FETs 312 and 313 in the first-inverting-stage should be sized appropriately so that node 306 can be pulled down to low logic state, in spite of contention by keeper P-FET 322 trying to keep node 306 in high logic state. When node 306 is successfully pulled down to low logic state and subsequently node 305 is pulled up to high logic state, keeper P-FET 322 is turned off and contention disappears.

The feed-back circuit 370 has two internal nodes 305 and 307, but writing (i.e. forcing low or high logic state) during transparent mode is carried out only from one side, i.e., node 305. This configuration can be referred to as dual polarity write on single node (i.e. to write low or high logic state on single node). There is also contention from the feed-back circuit 370 during writing. This contention arises when the second-inverting-stage tries to force a desired logic state (low logic state or a high logic state) on node 305, with fourth-inverting-stage trying to force the opposite logic state on node 305. Once again, the FET sizes in the second-inverting-stage should be sized appropriately so that node 305 can be brought to a desired logic state (low logic state or high logic state), in spite of the contention from the fourth-inverting-stage. Once the node 305 has successfully switched to the desired logic state, the contention disappears.

During the hold mode, with CLK 340 in low logic state, the back-to-back connection of the third-inverting-stage and the fourth-inverting-stage in feed-back circuit 370 stores the previous logic state at storage node 305. It is important to ensure that feed-forward circuit 360 does not attempt to disturb the logic state at storage node 305 during the hold mode. With CLK 340 at low logic state and data-in at D 330 at a high logic state during hold mode, node 306 cannot be ensured to maintain high logic state without the keeper P-FET 322. Thus, the keeper P-FET 322 has been added to maintain node 306 at high logic state during the hold mode under that condition, which keeps P-FET 314 non-contending by maintaining an off state. If P-FET 314 was not disabled using the keeper P-FET 322, the contention could lead to a disturbance or reliability concern at storage node 305.

It is not necessary to have a keeper in the other direction (pull down), to maintain the node 306 at low logic state during the hold mode. In that condition, keeper P-FET 322 is in a disabled condition. If for some reason, such as coupling or leakage or data-in D 330 in low logic state, node 306 becomes high logic state during hold mode, this does not pose a problem. This is due to the fact that storage node 305 is blocked from being pulled down because of isolation N-FET 315. During the hold mode, the N-FET 315 is in an off state because of CLK 340 in low logic state. The above description further explains the reason that a keeper is only necessary in one direction (pull up), i.e., to maintain high logic state at node 306 during the hold mode for latch 300 described in the FIG. 3.

Figure 4:
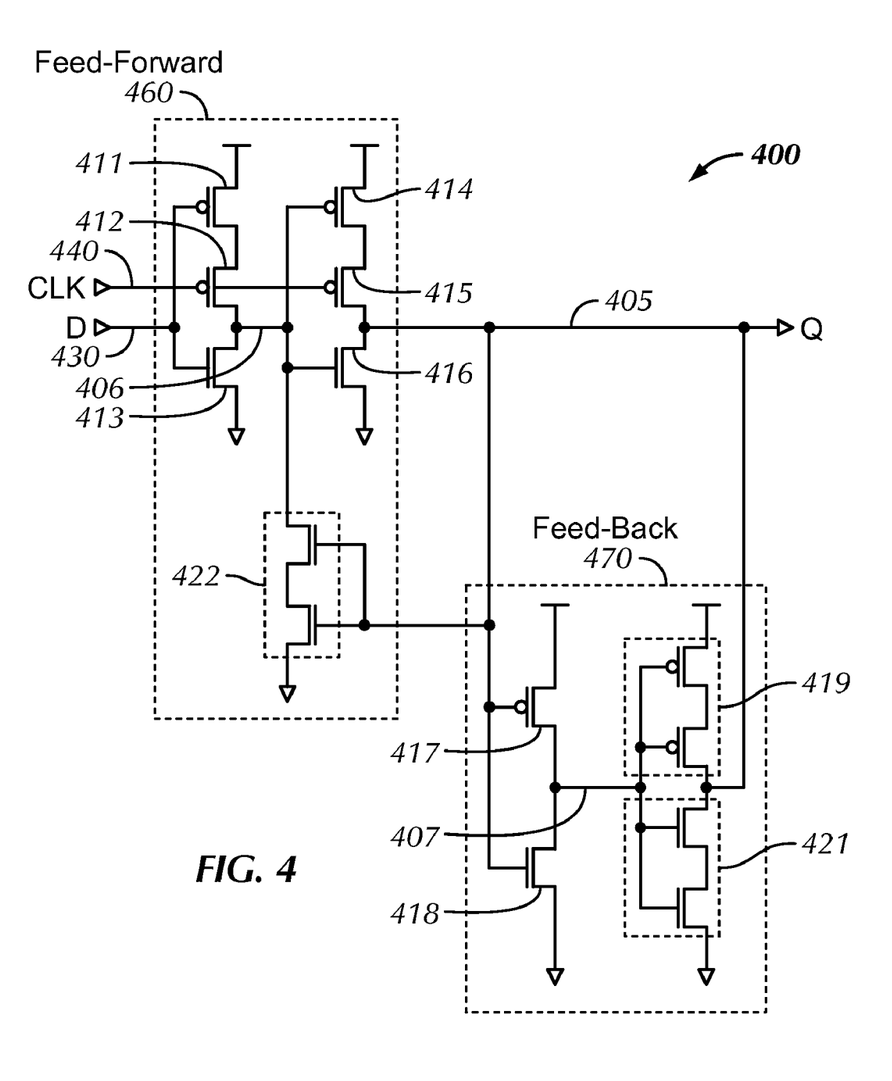
FIG. 4 shows a second latch with two clocked devices in accordance with one or more embodiments of the present invention.

FIG. 4 shows a second latch 400 with two clocked devices, P-FET 412 and P-FET 415, driven by source clock signal CLK 440, in accordance with one or more embodiments of the present invention. The output from the latch is Q (non-inverted latch output signal) 405, which is also the storage node. Because the latch 400 in FIG. 4 bears similarity with latch 300 in FIG. 3, description of similar features of latch in FIG. 4 will not be repeated.

As can be seen in FIG. 4, the latch 400 is in transparent mode for CLK 440 in low logic state and in hold mode for CLK 440 in high logic state. The polarity of the clock for latch 400 is the opposite of that for latch 300. That is, the latch 300 in FIG. 3 is in transparent mode for clock in high logic state and in hold mode for clock in low logic state. The difference comes from the fact that CLK 440 in FIG. 4 drives two P-FETs (412 and 415), whereas CLK 340 in FIG. 3 drives two N-FETs. Those skilled in the art will appreciate that a P-FET is enabled for low logic state applied to its gate and disabled for high logic state applied to its gate, whereas an N-FET is enabled for high logic state applied to its gate and disabled for low logic state applied to its gate.

Further, the keeper at node 406 in FIG. 4 is a pull down N-FET 422, unlike the latch 300 in FIG. 3, in which the keeper is a pull up P-FET. With CLK 440 at high logic state and data-in at D 430 in a low logic state during hold mode, node 406 cannot be ensured to maintain low logic state without the keeper N-FET 422. The keeper N-FET 422 has been added to maintain node 406 at low logic state during the hold mode under that condition, which keeps N-FET 416 non-contending by maintaining an off state. If N-FET 416 was not disabled using the keeper N-FET 422, the contention could lead to a disturbance or reliability concern at storage node 405.

It is not necessary to have a keeper in the other (pull up) direction, to maintain the node 406 at high logic state during the hold mode. In that condition, keeper N-FET 422 is in a disabled condition. If for some reason, such as coupling or leakage or data-in D 430 in high logic state, node 406 becomes low logic state during hold mode, this does not pose a problem. This is due to the fact that storage node 405 is blocked from being pulled up because of isolation P-FET 415. During the hold mode, the P-FET 415 is in off state because of CLK 440 in high logic state. The above description further explains the reason that a keeper is only necessary in one direction (pull down), i.e., to maintain low logic state at node 406 during the hold mode for latch 400 described in the FIG. 4.

Figure 5:
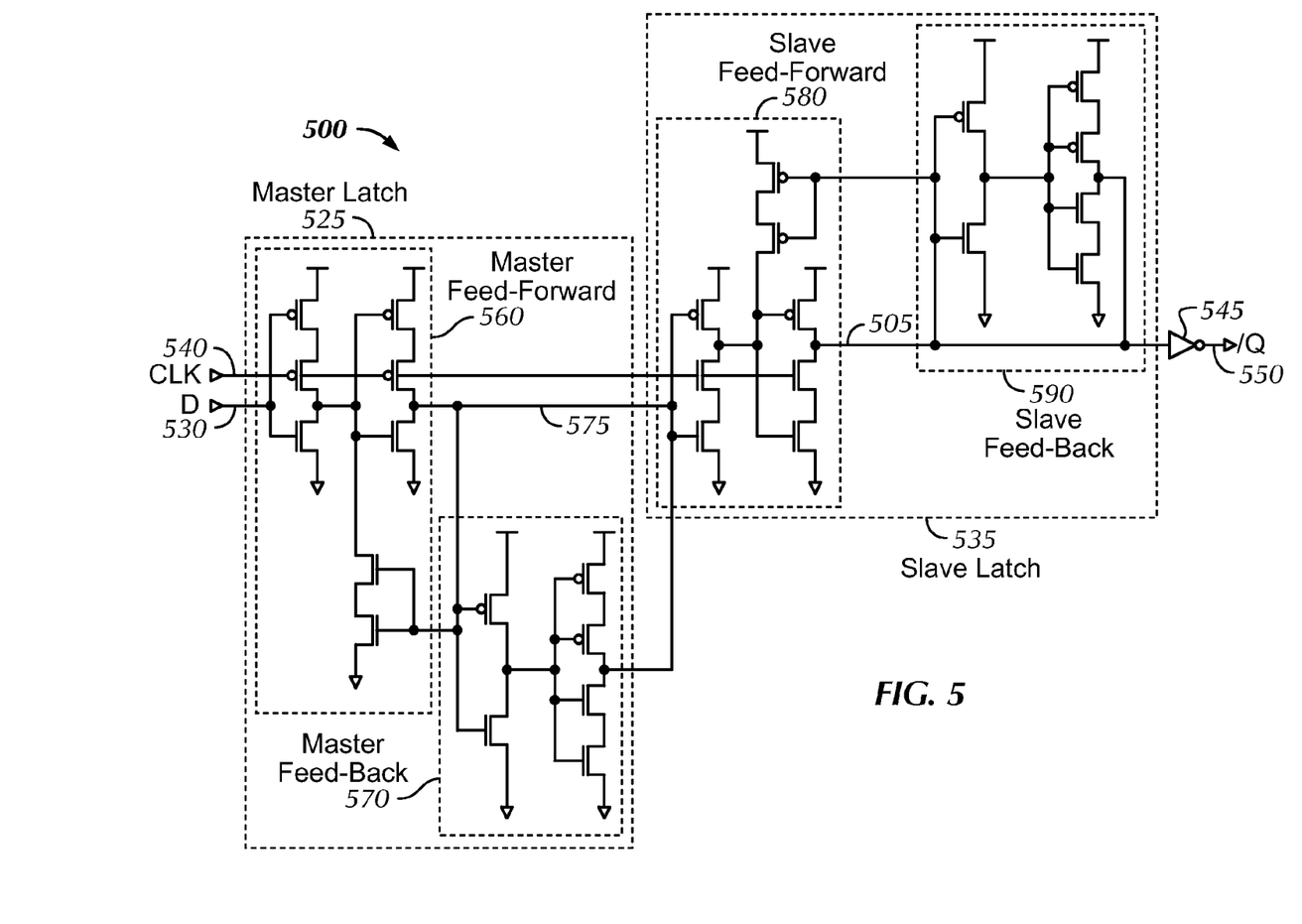
FIG. 5 shows master/slave flip-flop made with two latches with two clocked devices in accordance with one or more embodiments of the present invention.

FIG. 5 shows master/slave flip-flop 500 made with two latches each having two clocked devices in accordance with one or more embodiments of the present invention. The latches 300, 400 shown respectively, in FIGS. 3 and 4 are connected serially to build the master/slave flip-flop 500 of FIG. 5. The latch 400 shown in FIG. 4 is the master latch 525 comprising master feed-forward circuit 560 and master feed-back circuit 570, and the latch 300 shown in FIG. 3 is slave latch 535 comprising slave feed-forward circuit 580 and slave feed-back circuit 590.

The master latch 525 has master storage node 575 as its output. The master latch output at node 575 acts as input to the slave latch 535. The inverter 545 is an output buffer, with slave storage node 505 as input and /Q (inverted output signal) 550 as output. A total of four FETs, i.e., two FETs in each latch, are driven by CLK 540 in the flip-flop shown in FIG. 5. The master/slave flip-flop 500 in accordance with one or more embodiment of the invention, as shown in FIG. 5, reduces loading on CLK 540 by driving reduced FET count as compared to prior art flip-flops, which may require a source clock signal to drive 8-12, or more, FETs. The reduced loading on CLK 540 helps significantly in the reduction of switching current.

The operation of flip-flop in FIG. 5 can be readily understood based upon earlier description of latches 300, 400. For the CLK 540 in low logic state, the master latch 525 is in the transparent mode and transmits data-in provided at D 530 to the master storage node 575. For the CLK 540 in high logic state, master latch 525 is in hold mode and previous data is maintained at master storage node 575. However, the high logic state of CLK 540 is also the condition for slave latch 535 to be in transparent mode, which causes transmission of the previous maintained data at master storage node 575 to slave storage node 505. The data at slave storage node 505 is transmitted by the output buffer 545 as an inverted output signal /Q 550.

During a subsequent low logic state of CLK 540, slave latch 535 is in hold mode and maintains previous data at slave storage node 505. Thus, output data /Q 550 remains unchanged. However, the low logic state of CLK 540 is also the condition for master latch 525 to be in transparent mode, which causes transmission of the new data-in provided at D 530 to the master storage node 575. During subsequent high logic state of CLK 540, slave latch 535 is in transparent mode and the new data is transmitted from master storage node 575 to slave storage node 505, and then to output /Q 550.

Based upon this description, the output /Q 550 in this master/slave flip-flop changes once every clock cycle, on the low to high transition of CLK 540. It will be apparent to those knowledgeable in the art that other embodiments and variants of this flip-flop can be easily derived wherein output changes at high to low transition of the source clock signal.

Figure 6:
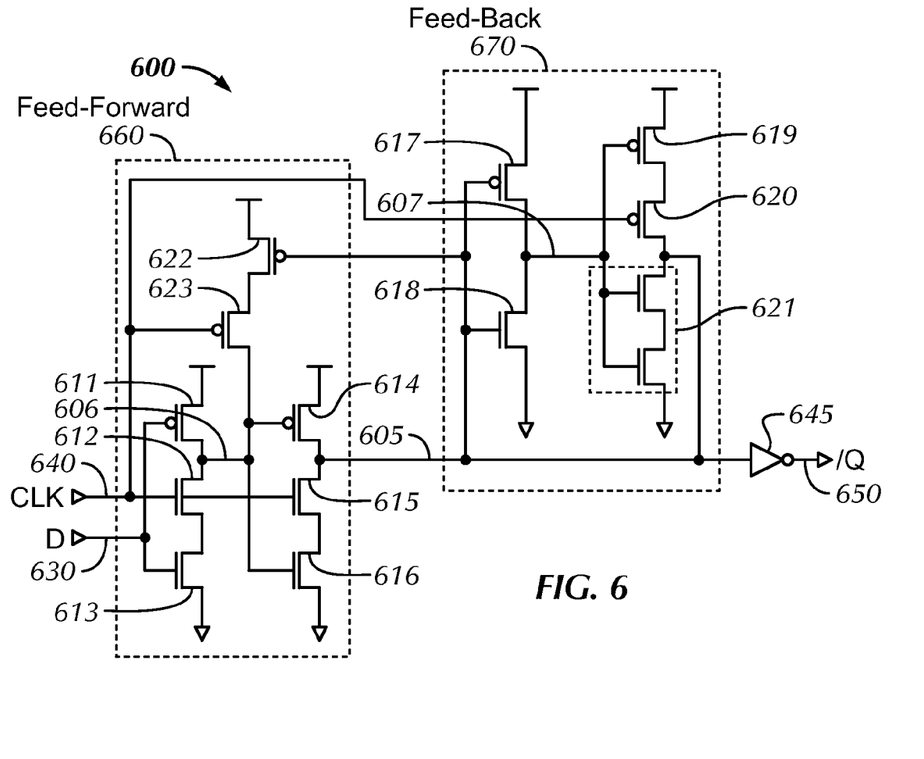
FIG. 6 shows a first latch with four clocked devices in accordance with one or more embodiments of the present invention.

FIG. 6 shows a latch 600 with four clocked devices, N-FET 612, N-FET 615, P-FET 620, and P-FET 623, driven by source clock signal CLK 640, in accordance with one or more embodiments of the present invention. Because the latch 600 in FIG. 6 bears similarity with latch 300 in FIG. 3, description of similar features of latch 600 will be omitted.

As can be seen in FIG. 6, the latch 600 has two additional P-FETs, P-FET 620 and P-FET 623. Both of these P-FETs are driven by CLK 640. These P-FETs are added to greatly resolve the contention issue described above with respect to latch 300. A high logic state of data-in at D 630 during transparent mode pulls down the node 606 to low logic state.

However, unlike with latch 300, there is no contention from the keeper trying to pull the node 606 high, because P-FET 623 is turned off by CLK 640 in high logic state during the transparent mode. This eliminates the writing problem due to contention, improves reliability, and removes the restriction that N-FETs 612 and 613 in the first-inverting-stage should be sized appropriately in view of contention.

There is also contention from the feed-back circuit while performing a write in latch 300. This contention arises when the second-inverting-stage tries to force a desired logic state on node 305, with fourth-inverting-stage trying to force the opposite logic state on node 305. However, for latch 600, the pull up action by fourth-inverting-stage is disabled because P-FET 620 is turned off by CLK 640 in a high logic state during transparent mode. Thus, node 605 can be driven to low logic state by the second-inverting-stage without contention from the fourth-inverting-stage, because P-FET 620 is turned off.

While the contention is resolved in one direction, there is still contention present in latch 600, if the second-inverting-stage drives node 605 to a high logic state in the transparent mode. The N-FET 621 can provide contention by trying to pull down the node 605 in that case. However, in latch 600, employing appropriately sized FETs can easily overcome such contention. That is, pull up action is by P-FET 614, which is a single P-FET and hence provides full strength, and pull down action is by N-FET 621, which is a dual N-FET and hence provides reduced strength. Those skilled in the art will appreciate that two FETs of same size in series have strength equivalent to about half as much as a single FET of same size.

In summary, the latch 600 of FIG. 6 has four FETs driven by source clock signal, and the latch 600 greatly resolves contention issues. Thus, latch 600 offers improved reliability. While the FET count driven by the source clock signal has gone up from two in latch 300 to four in latch 600, and thereby the switching current has increased, the increase in FET count and switching current is offset by improved writing and reliability. The latch shown in FIG. 6 also offers significant improvement over prior art latches, which typically compensated for contention by having a FET count of six or higher. The reduced clock loading of latch 600 as compared to such prior art latches helps significantly in the reduction of switching current.

Figure 7:
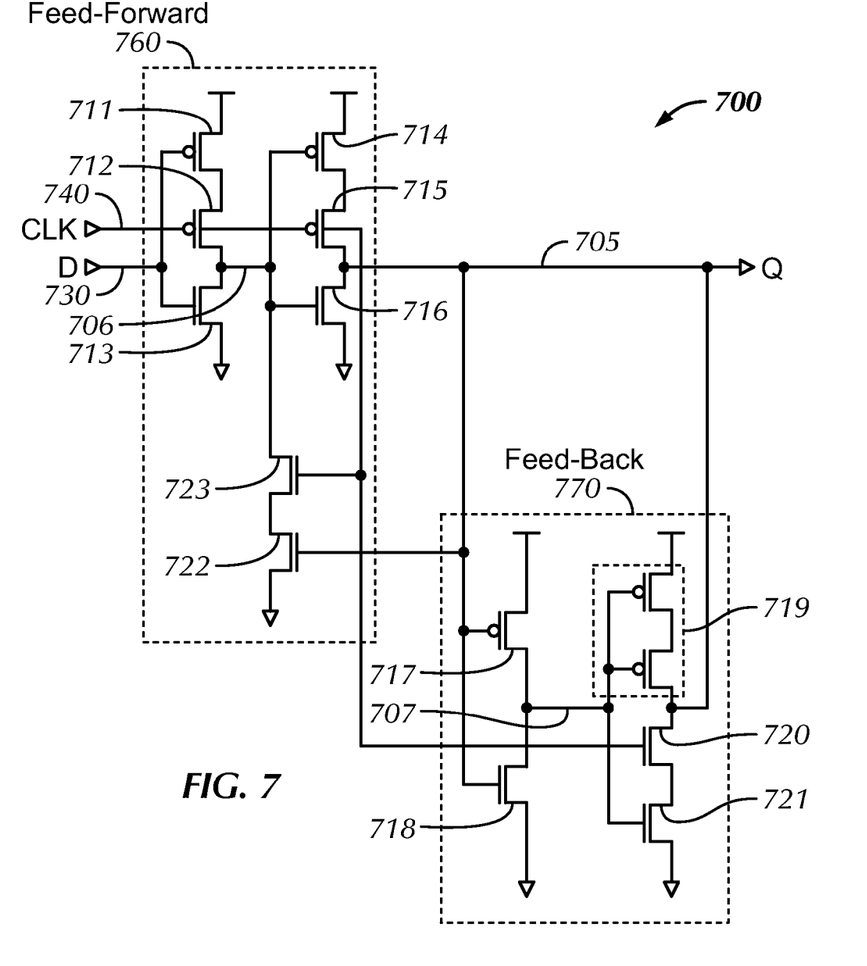
FIG. 7 shows a second latch with four clocked devices in accordance with one or more embodiments of the present invention.

FIG. 7 shows a second latch with four clocked devices, P-FET 712, P-FET 715, N-FET 720, and N-FET 723, driven by source clock signal CLK 740, in accordance with one or more embodiments of the present invention. Because the latch 700 in FIG. 7 bears similarity with latches 400 and 600, description of similar features of latch 700 is omitted.

The latch 700 is in transparent mode for CLK 740 in low logic state and in hold mode for CLK 740 in high logic state. The polarity of the clock for latch 700 is the opposite of the clock of the latch 600. That is, latch 600 is in transparent mode for clock in high logic state and in hold mode for clock in low logic state. The latch in FIG. 7 also offers an improvement over the latch in FIG. 4 by reducing contention. That contention is eliminated by turning off N-FET 723 during the transparent mode by applying low logic state to CLK 740.

The contention offered by feed-back circuit 770 is also greatly improved. This contention arises when the second-inverting-stage tries to force a desired logic state on node 705, with fourth-inverting-stage trying to force the opposite logic state on node 705. However, for latch 700, the pull down action by fourth-inverting-stage is disabled because N-FET 720 is turned off by CLK 740 in a low logic state during transparent mode. Thus, node 705 can be driven to high logic state by the second-inverting-stage without contention from the fourth-inverting-stage, since N-FET 720 is turned off.

While the contention is resolved in one direction, there is still contention present in latch 700, if the second-inverting-stage drives node 705 to a low logic state in the transparent mode. The P-FET 719 can provide contention by trying to pull up the node 705 in that case. However, in latch 700, employing appropriately sized FETs can easily overcome such contention. That is, pull down action is by N-FET 716, which is a single N-FET and hence provides full strength, and pull up action is by P-FET 719, which is a dual P-FET and hence provides reduced strength.

In summary, latch 700 has four FETs driven by the source clock signal, and the latch 700 greatly resolves contention issues and, thus, improves reliability. While the FET count driven by the source clock signal has gone up from two in latch 400 to four in latch 700, which thereby increases the switching current, the increase in FET count and switching current is offset by improved writing and better reliability. The latch 700 also offers significant improvement over prior art latches, which typically compensated for contention by having a FET count of six or higher. The reduced clock loading of latch 700 as compared to prior art latches helps significantly in the reduction of switching current.

Figure 8:
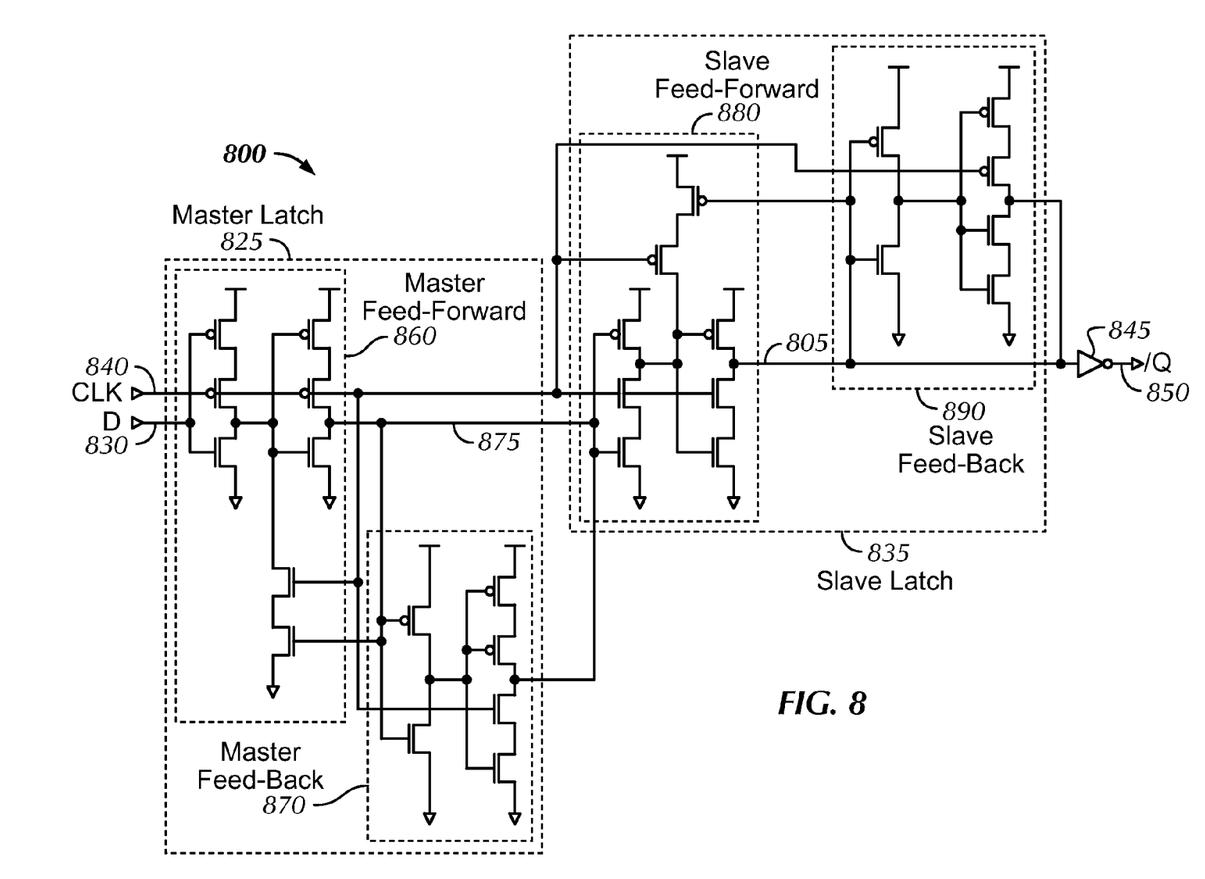
FIG. 8 shows master/slave flip-flop made with two latches with four clocked devices in accordance with one or more embodiments of the present invention.

FIG. 8 shows master/slave flip-flop 800 made with two latches each having four clocked devices in accordance with one or more embodiments of the present invention. The operation of master/slave flip-flop 800 in FIG. 8 bears similarity to the master/slave flip-flop 500 in FIG. 5. Accordingly, description of the similar features of master/slave flip-flop 800 is omitted While the FET count driven from the source clock signal is eight in master/slave flip-flop 800 as compared to four in master/slave flip-flop 500, which increases the switching current, the increase in FET count and switching current is offset by improved writing and better reliability. The master/slave flip-flop 800 greatly resolves contention issues and, thus, improves reliability. The master/slave flip-flop 800 also offers significant improvement over prior art master/slave flip-flops, which typically compensated for contention by having a FET count of twelve or higher. The reduced clock loading of the master/slave flip-flop 800 as compared to prior art master/slave flip-flops helps significantly in the reduction of switching current.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:
1. A latch circuit comprising:
    a feed-forward circuit comprising:
        a first-inverting-stage with a first input and a first output, wherein the first-inverting-stage comprises a first clocked device with gate driven by a source clock signal,
        a second-inverting-stage with a second input and a second output, wherein the second-inverting-stage comprises a second clocked device with gate driven by the source clock signal, and wherein the first output is operatively connected to the second input,
        a keeper circuit operatively connected to the first output, wherein the keeper circuit is driven from the second output; and
    a feed-back circuit comprising:
        a third-inverting-stage with a third input and a third output, wherein the third input is operatively connected to the second output,
        a fourth-inverting-stage with a fourth input and a fourth output, wherein the fourth input is operatively con- nected to the third output, and wherein the fourth output is connected to the third input to form a storage node,
wherein the latch circuit consists of no more than four clocked devices that switch with the source clock signal.

2. The latch circuit of claim 1, wherein the latch circuit consists of no more than two clocked devices that switch with the source clock signal.

3. The latch circuit of claim 1, wherein the keeper circuit provides one of a pull up function or a pull down function.

4. The latch circuit of claim 1, wherein the keeper circuit further comprises a third clocked device with gate driven by the source clock signal, and wherein the keeper circuit is disabled depending on state of the source clock signal.

5. The latch circuit of claim 1, wherein the fourth-inverting-stage further comprises a fourth clocked device with gate driven by the source clock signal, and wherein one of pull up action or pull down action in fourth-inverting-stage is disabled depending on state of the source clock signal.

6. The latch circuit of claim 1, further comprising: a second latch circuit of inverse polarity from the latch circuit, wherein the latch circuit and second latch circuit are coupled so as to form a master/slave flip-flop.

7. A semiconductor device comprising:
a mechanical package; and
a semiconductor die comprising:
a semiconductor layer,
a plurality of metal layers,
a clock distribution network that distributes a clock signal within the die, and
a latch circuit comprising:
a feed-forward circuit comprising:
a first-inverting-stage with a first input and a first output, wherein the first-inverting-stage comprises a first clocked device with gate driven by a source clock signal, and wherein the source clock signal is derived from the clock signal,
a second-inverting-stage with a second input and a second output, wherein the second-inverting-stage comprises a second clocked device with gate driven by the source clock signal, and wherein the first output is operatively connected to the second input,
a keeper circuit operatively connected to the first output, wherein the keeper circuit is driven from the second output, and
a feed-back circuit comprising:
a third-inverting-stage with a third input and a third output, wherein the third input is operatively connected to the second output,
a fourth-inverting-stage with a fourth input and a fourth output, wherein the fourth input is operatively connected to the third output, and wherein the fourth output is connected to the third input to form a storage node,
wherein the latch circuit consists of no more than four clocked devices that switch with the source clock signal.

8. The semiconductor device of claim 7, wherein the latch circuit consists of no more than two clocked devices that switch with the source clock signal.

9. The semiconductor device of claim 7, wherein the keeper circuit provides one of a pull up function or a pull down function.

10. The semiconductor device of claim 7, wherein the keeper circuit further comprises a third clocked device with gate driven by the source clock signal, and wherein the keeper circuit is disabled depending on state of the source clock signal.

11. The semiconductor device of claim 7, wherein the fourth-inverting-stage further comprises a fourth clocked device with gate driven by the source clock signal, and wherein one of pull up action or pull down action in fourth-inverting-stage is disabled depending on state of the source clock signal.

12. The semiconductor device of claim 7, further comprising: a second latch circuit of inverse polarity from the latch circuit, wherein the latch circuit and second latch circuit are coupled so as to form a master/slave flip-flop.

13. A system comprising:
an input device;
an output device;
a mechanical chassis;
a printed circuit board; and
a semiconductor device comprising:
a mechanical package, and
a semiconductor die comprising:
a semiconductor layer,
a plurality of metal layers,
a clock distribution network that distributes a clock signal within the die, and
a latch circuit comprising:
a feed-forward circuit comprising:
a first-inverting-stage with a first input and a first output, wherein the first-inverting-stage comprises a first clocked device with gate driven by a source clock signal, and wherein the source clock signal is derived from the clock signal,
a second-inverting-stage with a second input and a second output, wherein the second-inverting-stage comprises a second clocked device with gate driven by the source clock signal, and wherein the first output is operatively connected to the second input,
a keeper circuit operatively connected to the first output, wherein the keeper circuit is driven from the second output, and
a feed-back circuit comprising:
a third-inverting-stage with a third input and a third output, wherein the third input is operatively connected to the second output,
a fourth-inverting-stage with a fourth input and a fourth output, wherein the fourth input is operatively connected to the third output, and wherein the fourth output is connected to the third input to form a storage node,
wherein the latch circuit consists of no more than four clocked devices that switch with the source clock signal.

14. The system of claim 13, wherein the latch circuit consists of no more than two clocked devices that switch with the source clock signal.

15. The system of claim 13, wherein the keeper circuit provides one of a pull up function or a pull down function.

16. The system of claim 13, wherein the keeper circuit further comprises a third clocked device with gate driven by the source clock signal, and wherein the keeper circuit is disabled depending on state of the source clock signal.

17. The system of claim 13, wherein the fourth-inverting-stage further comprises a fourth clocked device with gate driven by the source clock signal, and wherein one of pull up action or pull down action in fourth-inverting-stage is disabled depending on state of the source clock signal.

18. The system of claim 13, further comprising: a second latch circuit of inverse polarity from the latch circuit, wherein the latch circuit and second latch circuit are coupled so as to form a master/slave flip-flop.

* * * * *